United States Patent [19]
Wang et al.

[11] Patent Number: 5,288,652
[45] Date of Patent: Feb. 22, 1994

[54] BICMOS-COMPATIBLE METHOD FOR CREATING A BIPOLAR TRANSISTOR WITH LATERALLY GRADED EMITTER STRUCTURE

[75] Inventors: Chung S. Wang, Fremont; Ying-Tsong Loh, Saratoga; Edward D. Nowak, Pleasanton, all of Calif.

[73] Assignee: VLSI Technology, Inc., San Jose, Calif.

[21] Appl. No.: 993,229

[22] Filed: Dec. 18, 1992

[51] Int. Cl.$^5$ .................... H01L 21/265; H01L 29/70
[52] U.S. Cl. ......................................... 437/31; 437/44; 437/59; 437/912
[58] Field of Search ...................... 437/912, 59, 44, 31

[56] References Cited

U.S. PATENT DOCUMENTS

| | | | |
|---|---|---|---|
| 5,217,910 | 6/1993 | Shimizu et al. | 437/44 |
| 5,219,784 | 6/1993 | Solheim | 437/44 |
| 5,231,042 | 7/1993 | Ilderem et al. | 437/44 |
| 5,234,850 | 8/1993 | Liao | 437/44 |

*Primary Examiner*—Olik Chaudhuri
*Assistant Examiner*—Long Pham
*Attorney, Agent, or Firm*—Flehr, Hohbach, Test, Albritton & Herbert

[57] ABSTRACT

A bipolar transistor is fabricated in a CMOS-compatible process with a laterally graded emitter structure that is fabricated in a "top-down" implant process. The laterally graded emitter decreases electric field intensities in the emitter-base junction under reverse bias, thus reducing hot carrier generation and improving emitter-base junction breakdown voltage. High current gain is further maintained by establishing sharply defined emitter-base junctions. During fabrication a blocking layer and overlying cap layer are formed in an inverted "T" shape over a desired emitter window region. Lateral projection of the cap ledges are used to define the laterally graded emitter width, while the distance separating the cap ledges defines the width of the central emitter region. The central emitter region is implanted and driven-in to a desired depth, after which the protective cap is removed. The entire emitter window region is then implanted with a like polarity dopant of lesser dosage, which dopant is then driven-in to form laterally graded emitter junctions of a desired depth. A BiCMOS integrated circuit may be fabricated with bipolar transistors of either polarity and with MOS transistors of either polarity, using substantially the same process steps. The resultant MOS devices have lightly doped drain regions to enhance MOS hot carrier performance.

45 Claims, 2 Drawing Sheets

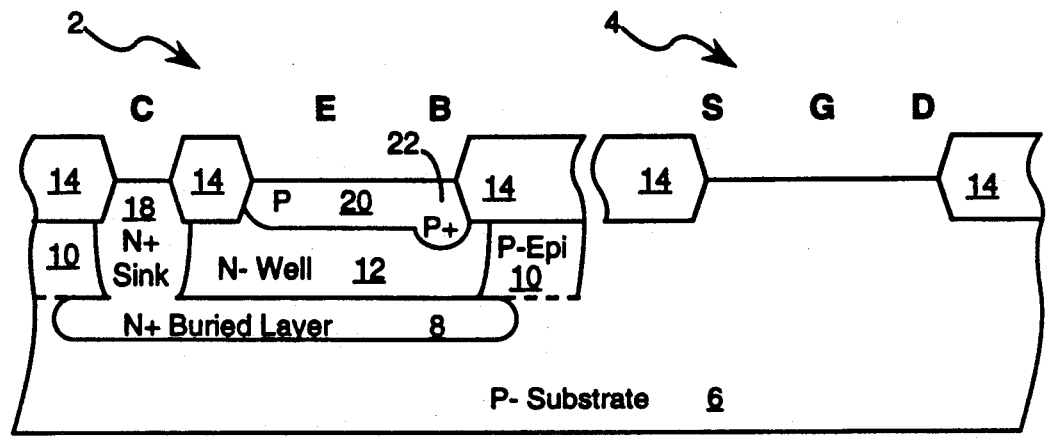
FIGURE 1 *Prior Art*
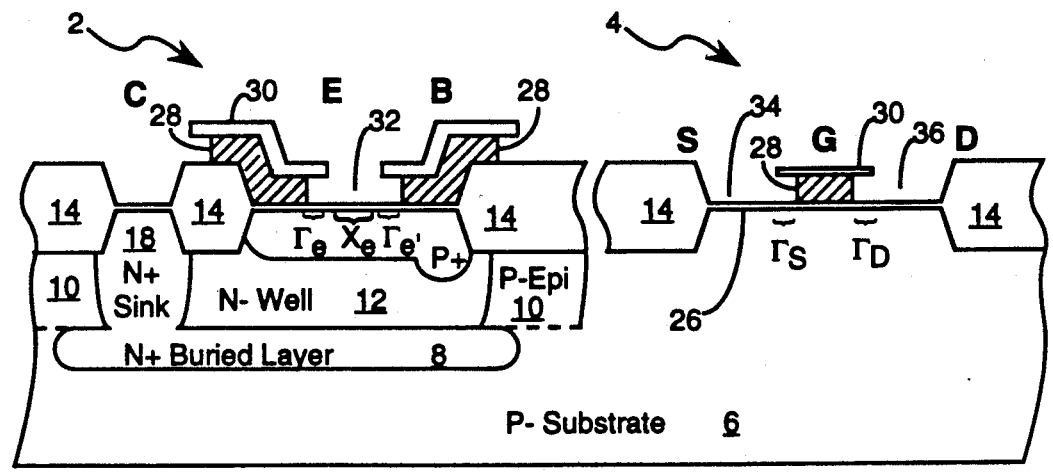
FIGURE 2
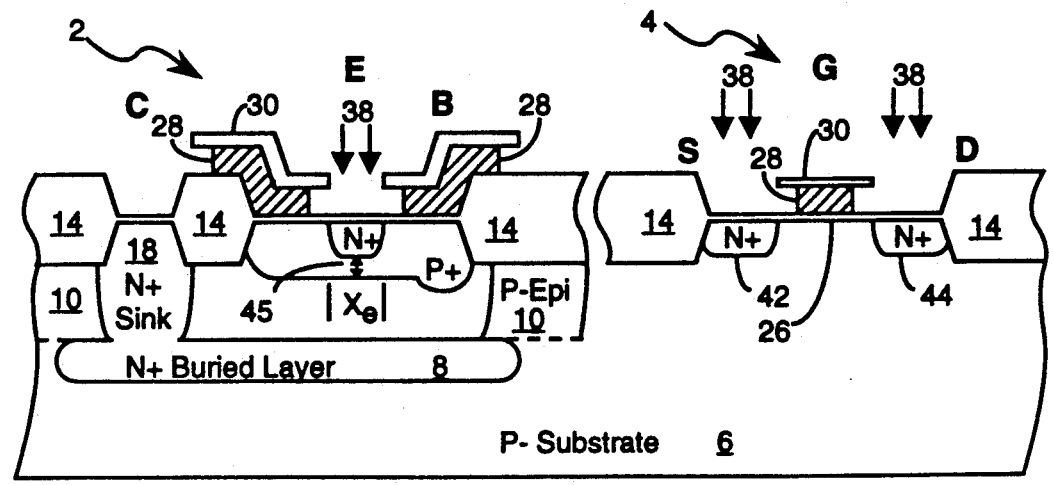
FIGURE 3

BICMOS-COMPATIBLE METHOD FOR CREATING A BIPOLAR TRANSISTOR WITH LATERALLY GRADED EMITTER STRUCTURE

The present invention relates generally to fabricating bipolar transistors for use in bipolar-complementary metal-oxide-silicon ("BiCMOS") applications, and more particularly to a method and structure providing a bipolar transistor with a lateral graded emitter.

BACKGROUND OF THE INVENTION

It is common in the art to combine bipolar transistors and complementary metal-oxide silicon ("CMOS") field effect transistors in a bipolar-complementary metal-oxide-silicon ("BiCMOS") transistor configuration. BiCMOS configurations are widely used in fabricating ever smaller, faster and increasingly complex integrated circuits. BiCMOS integrated circuits are fabricated layer-by-layer, typically on a silicon substrate, with one or more layers at least partially covered with an oxide such as $SiO_2$.

In general, high cut-off frequency performance is desired in a BiCMOS circuit. Such high frequency performance is enhanced by providing small geometry bipolar devices with reduced emitter-base junction area and junction capacitance. Smaller geometry devices not only promotes operating speed, but also allows greater device density within a BiCMOS circuit. However in BiCMOS fabrication, process steps that create small geometry bipolar devices frequently cannot be used to simultaneously create MOS devices. The inability to make dual use of many processing steps thus adds to the complexity of BiCMOS fabrication, and can result in reduced device yield.

Another undesired effect of scaling down device size is degraded device performance, especially junction leakage and degradation of current gain. Scaling down device dimensions and increasing doping concentrations tends to increase electric field intensities to which the devices are exposed, since operating potentials are generally fixed. For example, reverse biased depletion regions within a small geometry bipolar transistor can be subjected to relatively high intensity electric fields.

Electrons encountering these increased field intensities acquire increased kinetic energy and accelerate beyond an equilibrium state, becoming what is commonly termed "hot electrons" or "hot carriers". Hot carriers can escape from the semiconductor, surmount and remain trapped within an oxide layer within the device.

More specifically, the trapped charges form a local depletion region, wherein holes and electrons recombine, typically with a decreased surface recombination lifetime. Unfortunately the holes required to neutralize or satisfy the surface recombination current are holes diverted from the transistor's base current. The resultant surface effect decreases the transistor current gain ($\beta$). The result is degraded bipolar performance.

It is known in the art that providing a sharp emitter-base transition will result in high current gain ($\beta$). However forming such emitter-base regions in small geometry devices using BiCMOS compatible techniques is challenging because of the difficulty in independently controlling the junction depths of the variously doped regions.

It is known in the art to improve high frequency performance by reducing the extrinsic base resistance of a bipolar transistor by increasing base junction dopant levels. Unfortunately, under reverse bias conditions, increased dopant concentrations result in smaller depletion regions, which increases the electric field to which the emitter-base junction is subjected. This in turn can produce increased numbers of hot carriers, with resultant degradation of device performance.

It is known in the art to suppress hot carrier effects using a laterally graded emitter structure that decreases peak electric fields between the emitter and base regions of a transistor. See for example H. Honda, et al., I.E.E.E. CH2865-4/90/0000-0227 (1990). Although it is recognized in the art that a sharp emitter-base transition improves bipolar current gain $\beta$, the method disclosed by Honda, et al. does not readily allow independent control over the bipolar transistor's base width and active region, or the profile of the laterally graded emitter for purposes of optimizing bipolar performance.

In short, while contemporary integrated circuit design demands smaller device size, smaller device size is accompanied by significant hot carrier effects that degrade bipolar transistor performance. What is needed is a manufacturing process permitting optimization of junction device parameters to produce a laterally graded emitter that decreases hot carrier generation in a bipolar device. The emitter-base junction in such a device should have a sharp transition, further promoting high current gain. Preferably such process should be BiCMOS compatible, allowing bipolar and CMOS fabrication steps to occur simultaneously on a common integrated circuit substrate. The present invention discloses such a process.

SUMMARY OF THE INVENTION

The present invention provides a bipolar transistor with a laterally graded emitter structure that decreases electric field intensities, thus reducing hot carrier generation. The resultant hot carrier reduction preserves the transistor current gain $\beta$, and improves the emitter-base junction breakdown voltage. In one aspect of the present invention, the width and depth of laterally graded emitter regions of the bipolar device, and bipolar base region, are controlled independently by use of a sacrificial mask that includes overhanging ledges, and by controlling dopant drive-in temperature and time. The resultant bipolar transistor has a sharply defined emitter-base junction that further promotes high current gain. According to the present invention, bipolar transistors may be fabricated simultaneously and side-by-side with CMOS devices on a common substrate, the CMOS devices also exhibiting improved hot carrier performance.

Preliminarily, prior art processing steps produce a substrate having conventional collector and base depositions for a bipolar device, as well as isolation wells and isolating local oxide regions. If a MOS device is also to be produced, conventional threshold voltage masking, implant and gate oxide steps are performed.

The substrate is then covered, respectively, with an oxide, a blocking layer that is then doped, and an overlying cap layer. The cap layer and blocking layer are etched to define an emitter window for a bipolar device and to define source and drain windows for a MOS device. The emitter, source and drain windows include overhanging ledges of cap material that result from undercutting the cap layer during etching of the blocking layer. Preferably the bipolar emitter window resembles an inverted "T", while the MOS cap and block layer resemble an upright "T".

According to the present invention, the lateral extent of the ledges overhanging the emitter, source and drain windows determines the lateral extent of what will be the lightly doped regions of the desired bipolar emitter, and lightly doped source and drain regions of the MOS device. The lateral extent of the central (more highly doped) bipolar emitter region is determined by the lateral distance between the ledges overhanging the emitter window.

Exposed emitter, source and drain window regions, unprotected by an overlying cap ledge, are implanted with a first polarity dopant. The dopant is then driven-in forming the central emitter junction to a desired junction depth, and further forming MOS source and drain regions to a desired depth. This driving-in further determines the bipolar base width. According to the present invention, the temperature and duration of this drive-in process are controlled to govern junction depth of the more highly doped regions of the devices being formed.

The protective cap is removed and a second, significantly lower dosage implant (preferably at least a factor of ten lower than the first implant dosage) of the same polarity as the first implant dopant is made into the now exposed emitter, source and drain regions. A preferably low temperature driving-in controllably forms shallow lightly doped emitter regions, and lightly doped drain regions, to a desired depth. According to the present invention, the temperature and duration of the second drive-in process are controlled to govern the depth of the lightly doped regions of the devices being formed. Alternatively, a single drive-in process step may be used to drive dopant into the relatively highly doped and lightly doped regions of the devices being formed.

Normal backend processing follows wherein the MOS gate is completed, and metal or other appropriate are made to the bipolar emitter, base and collector regions, and to the NMOS gate, source and drain regions.

Other features and advantages of the invention will appear from the following description in which the preferred embodiments have been set forth in detail in conjunction with the accompanying drawings.

BRIEF DESCRIPTION OF THE DRAWINGS

FIG. 1 depicts initial process steps to fabricate an NPN bipolar device and an NMOS device, according to the prior art.

FIG. 2 depicts formation of overhanging ledge-like structures defining emitter, source and drain windows, according to the present invention.

FIG. 3 depicts formation of the highly doped regions of a bipolar emitter, and formation of source and drain regions for a MOS device, according to the present invention.

DESCRIPTION OF THE PREFERRED EMBODIMENTS

Figure 4:
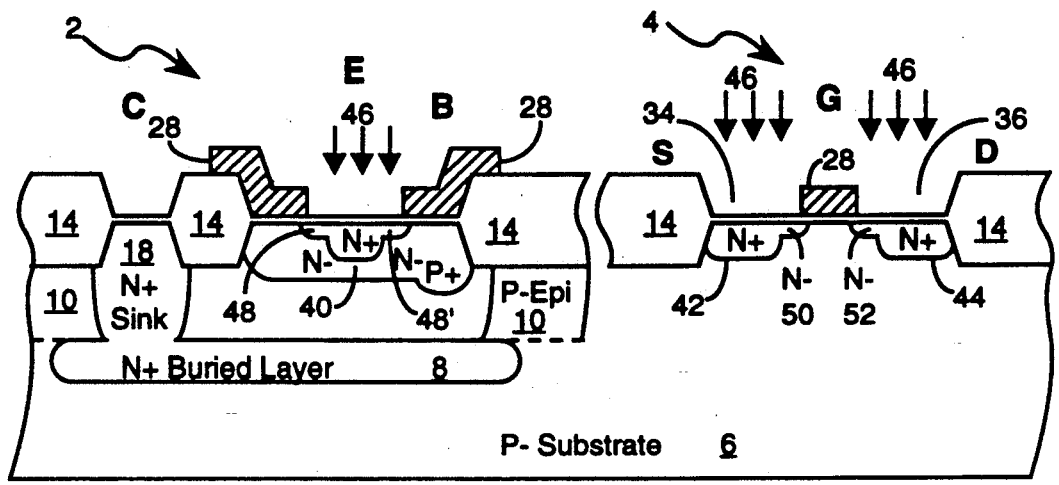
FIG. 4 depicts formation of the laterally graded emitter regions of a bipolar emitter, and formation of lightly doped drain regions for a MOS device, according to the present invention.

In brief overview, the present invention provides a bipolar transistor with a laterally graded emitter that decreases electric fields across the emitter-base junction, thus reducing hot carrier generation under reverse bias and improving emitter-base breakdown characteristics. During fabrication, the use of a blocking layer and protective cap permits implanting and defining a bipolar emitter junction to a desired depth, and also determines base width. Further, the blocking layer and cap allows MOS devices to be simultaneously fabricated with readily definable laterally graded source regions, for improved MOS device hot carrier performance.

FIG. 1 depicts a preliminary stage in the formation of an NPN bipolar device, and an N-channel MOS device, wherein "C", "E" and "B" designate collector, emitter and base regions, and "S", "D" and "G" designate source, drain and gate regions, which regions are formed, or will be formed. Although the preferred embodiment will be described with reference to fabricating an NPN bipolar transistor 2 and an NMOS transistor 4, it is understood that with slightly modified procedures, transistor 2 could be fabricated as a PNP device, and that transistor 4 could be fabricated as an P-channel MOS device.

A P-substrate 6 has selectively diffused into it an N+ buried layer 8 that helps reduce bulk resistance of transistor 2's collector region, after which P- epitaxial (or "epi") regions 10, and an N- well 12 are defined. Regions of local oxide ("LOCOS") 14 are formed to isolate adjacent devices on substrate 6 (e.g., devices 2 and 4), after which an N+ sink region 18 is formed communicating with the N+ buried layer 8. An intrinsic base 20 is formed for bipolar device 2, preferably with a depth of about $0.45\mu$ although other depths could of course be formed. Preferably the intrinsic base 20 includes a more heavily doped base plug region 22 that improves ohmic contact between the intrinsic base and an external lead, formed later during backend processing. Fabrication of the preliminary structures shown in FIG. 1 is known to those skilled in the art, and does not per se form part of the present invention.

With reference to FIG. 2, a sacrificial oxide layer such as $SiO_2$ (not shown) is grown over devices 2 and 4, and conventional gate threshold voltage ($V_t$) masking and dopant implant steps are carried out with respect to NMOS 4. The sacrificial oxide layer is then removed and a gate oxide 26 is formed on the exposed substrate regions.

A blocking layer 28 is then deposited to a thickness of about 2000 Å to about 4000 Å and is doped (if the blocking layer is polysilicon). Preferably doping of the polysilicon blocking layer 28 is carried out using phosphorous (P) with a dosage of about $1 \times 10^{20}/cm^2$ and an implant energy of about 50 kV. A protective cap layer 30 is formed atop layer 28 to a thickness of about 500 Å to about 1,000 Å, preferably by a low pressure chemical vapor deposition ("LPCVD") process. For BiCMOS fabrication, the blocking layer 28 is preferably limited to polysilicon. For bipolar fabrication, or BiCMOS production where the laterally graded bipolar emitter and the lightly doped drain MOS regions are not produced simultaneously, the cap layer 30 and blocking layer 28 can include the following combinations: photoresist and oxide, photoresist and nitride, photoresist and polysilicon, oxide and nitride, nitride and oxide, and the like.

Conventional lithographic definition steps are then carried out to define an emitter region window 32, and source and drain region windows 34, 36. Windows 32, 34, 36 are depicted in FIG. 2 with one boundary shown in phantom. Cap layer 30 is then preferably reactive ion etched (RIE) down to the layer 28, which layer 28 is then preferably plasma etched to undercut cap layer 30. The result is the overhanging ledge-like structure depicted in FIG. 2.

With reference to the emitter window 32 shown in FIG. 2, an inverted "T"-like structure has been formed. The ledge-like regions of cap 30 extend laterally distances $\Gamma_e$, $\Gamma_e$, toward the inverted stem of the inverted "T" due to the undercutting action of the plasma etch. Note that window 32 includes a central region $X_e$ that is not protected by an overextending cap ledge, i.e., $X_e$ falls within the stem region of the inverted "T".

With respect to source and drain windows 34, 36, an upright "T"-like structure has been formed. Ledge-like regions of cap 30 extend laterally distances $\Gamma_s$, $\Gamma_d$ (e.g., the arms of the "T") due to the undercutting action of the plasma etch, while a central gate region lies directly under the stem of the "T".

Normally, the undercutting process results in symmetrical overhanging ledge-like cap regions, with each ledge $\Gamma_e$, $\Gamma_e$, $\Gamma_s$, $\Gamma_d$ typically overhanging a distance of about $0.20\mu$ to about $0.30\mu$. However with suitable intermediate masking steps, asymmetrical ledges could be produced.

According to the present invention, $\Gamma_e$, $\Gamma_e$, establish the width of the laterally graded (or lightly doped) emitter region of transistor 2, while $\Gamma_d$ and $\Gamma_s$ are used to establish the width of the lightly doped drain region for NMOS 4. Thus, the lateral extent of the undercut etch process determines the lateral extent of these lightly doped regions of devices 2 and 4. It is understood that as regards MOS device 4, the terms source and drain may be interchangeably used, and the expression lightly doped drain will refer to MOS device 4's lightly doped drain and lightly doped source regions.

As depicted by arrows 38 in FIG. 3, the relatively highly doped (N+) central region 40 of NPN transistor 2's emitter region 32, and the relatively highly doped (N+) source and drain regions 42, 44 of MOS device 4 are now formed. Preferably an N+ dopant such as arsenic (As) with a dosage of about $3 \times 10^{15}/cm^2$ is implanted with a sufficiently low energy level (e.g., about 50 kV) as not to penetrate the protective cap region 30. As such, the ledges of cap region 30 substantially shield the substrate regions under these ledges from this N+ implant.

An annealing process then drives-in the emitter junction region 40 and source, drain regions 42, 44 to a desired depth. Typically each of regions 40, 42, 44 is formed to a depth of about $0.20\mu$ to about $0.30\mu$ by driving-in the previously implanted N+ dopant for about 30 minutes at about 900° C. According to the present invention, the temperature and duration of this drive-in process essentially determine the profile of these N+ regions, and further determines the effective bipolar device base width 45.

Thus where base region 20 was initially formed with a depth of about $0.45\mu$, the base width 45 beneath the N+ central emitter region 50 will be about $0.2\mu$. It will be appreciated that due to the protective shielding function of the overhanging cap ledges, the depth of the central emitter region, the source and drain region, and the base width are establishing without affecting the subsequently formed laterally graded emitter or lightly doped drain regions (to be described).

With reference to FIG. 4, having served its protective purpose, cap layer 30 is stripped off, exposing underlying layer 28. Removal of cap layer 30 also exposes the emitter regions formerly protected by the layer 30 $\Gamma_e$, $\Gamma_e$, ledges, as well as the source and drain regions formerly protected by the layer 30 $\Gamma_s$ and $\Gamma_d$ ledges.

The lateral regions of the NPN bipolar transistor emitter, and the lightly doped drain regions of the NMOS device are now formed. As depicted by arrows 46, transistor 2's emitter region 32 and MOS device 4' source and drain regions 34, 36 are now subjected to an N- implant, preferably using arsenic (As) or phosphorus (P) dopant with a dosage in the range of about $2 \times 10^{13}/cm^2$.

A preferably low temperature furnace annealing (or a rapid thermal annealing) procedure follows to drive-in the N- dopant without substantially altering the doping profile of the central emitter region. Typically this annealing step is very short, e.g., about 30 seconds at about 900° C., and results in a shallow N-penetration of about $0.1\mu$ to about $0.15\mu$ or $0.20\mu$. It should be appreciated that this low temperature annealing process is of short duration (preferably less than 10 percent of the duration of the first drive-in step) so as not to substantially change the depth of the previously formed N+ central emitter region 40, and N+ source and drain regions 42, 44.

With respect to bipolar device 2, the N- implant and annealing steps produce controllably relatively shallow N- regions 48, 48' adjoining the deeper central N+ emitter region 40. The N- regions 48, 48' reduce not carrier generation.

With respect to MOS device 4, the N+ implant and annealing steps produce laterally (or lightly) doped N− source and drain regions 50, 52 adjoining the N+ source and drain regions 42, 44. The lightly doped source and drain regions 50, 52 improve MOS device 4's characteristics with respect to hot carriers.

Thus, the present invention advantageously provides independent control over the relative depths of the various N+ and N− junctions.

In an alternative embodiment, a single drive-in step is performed after the N-implant. This single drive-in step controls the depth of the N+ and N− emitter regions, as well as the depth of the N+ and N− source and drain regions. It will be appreciated that this methodology advantageously saves one process step.

With regard to bipolar device 2, in the presence of a reverse emitter-base voltage, the relatively lightly doped lateral emitter regions 48, 48' experience a larger space charge region than the more heavily doped central emitter region 40. The desired result is that the reverse emitter-base potential is distributed over a larger effective space charge distance, thus reducing the magnitude of the electric field in regions 48, 48'. This in turn minimizes hot carrier generation, and tends to protect the emitter-base junction against premature voltage breakdown.

Similarly, the doping profile in the source and drain regions of NMOS 4 demonstrate a lateral gradient in that regions 50, 52 are more heavily doped (N+) than regions 46, 48 (e.g., N−) closer to the gate. As a result of these laterally doped drain regions, MOS device 4 will similarly have improved hot carrier performance.

Figure 5:
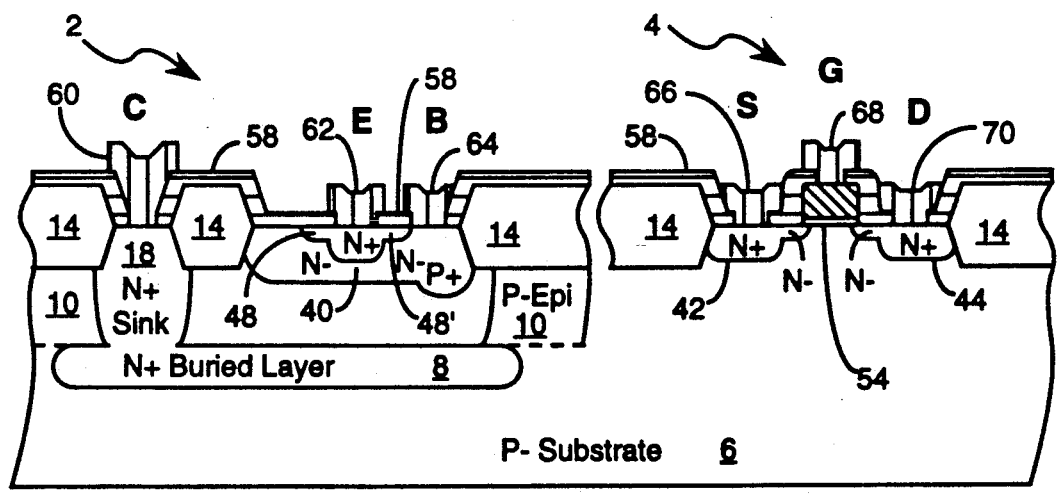
FIG. 5 depicts completed laterally graded BiCMOS devices, according to the present invention.

FIG. 5 depicts completion of bipolar device 2 and MOS device 4, after normal backend processes have been completed. Typically MOS device 4 is photomasked while the blocking layer 28 is stripped off bipolar device 2, a procedure allowing the blocking layer on the MOS oxide to form a polysilicon self-aligning MOS gate. The gate oxide 54 of the MOST gate represents the remaining portion of gate oxide layer 26 after the regions not protected by polysilicon (such as the portions of the blocking layer used to form MOS transistor gates) and/or photoresist have been removed. On both the bipolar device 2 and the MOS device 4, an oxide-insulator passivation layer 58 such as boron-phosphorous-silicate glass ("BPSG") or tetra-ethyl-ortho-silicate glass ("TEOS") is formed.

In FIG. 5, conductive traces 60, 62, 64, 66, 68 and 70 make contact with the respective collector, emitter and base regions of bipolar transistor 2, and source, gate and drain regions of MOS device 4. Because conventional backend processes are well understood in the art, further details are not given.

Modifications and variations may be made to the disclosed embodiments without departing from the subject and spirit of the invention as defined by the following claims. For example, while the present invention has been described with reference to a preferred BiCMOS embodiment, the present invention may be practiced to fabricate bipolar transistors on a substrate that does not also include MOS devices.

What is claimed is:

1. A method of fabricating, on a substrate that includes a collector region and a base region, a bipolar transistor with improved hot carrier characteristics, the method comprising the following steps:
   (a) forming above the base region a blocking layer and a cap layer overlying said blocking layer;
   (b) forming in said blocking and cap layers a central emitter window overlying a desired central emitter region, said window including a portion of said cap layer extending a desired lateral distance over said window;
   (c) implanting a first dopant through said central emitter window into said desired central emitter region at a first dosage level;
   (d) removing said cap layer;
   (e) implanting a dopant of like polarity to said first dopant through said central emitter window at a second dosage level significantly lower than said first dosage level; and
   (f) after at least one of said steps (c) and (e), driving-in said previously implanted dopant to form an emitter region with a depth determined by said driving-in step;
wherein said central emitter window determines said central emitter region's lateral extent, and
wherein said extending cap layer portion determines a lateral extent of a graded emitter region bounding said central emitter region, said graded emitter region being lightly doped relative to said central emitter region.

2. The method of claim 1, wherein said step (f) includes driving-in said first dopant implanted in step (c) to form a central emitter region to a depth having a range of about $0.20\mu$ to about $0.30\mu$.

3. The method of claim 1, wherein said step (f) includes driving-in said like polarity dopant implanted in step (e) to a depth having a range of about $0.1\mu$ to about $0.2\mu$.

4. The method of claim 1, wherein step (f) includes driving-in after step (c) and after step (e), and said driving-in after step (e) has a time duration less than ten percent of the duration of said driving-in after step (c).

5. The method of claim 1, wherein said step (f) includes a driving-in regime selected from the group consisting of driving-in immediately after step (c) for approximately 30 minutes at about 900° C., and driving-in immediately after step (e) for approximately 30 seconds at about 900° C.

6. The method of claim 1, wherein at least one of said step (f) includes an annealing process selected from the group consisting of low temperature furnace annealing and rapid thermal annealing.

7. The method of claim 1, wherein said step (b) includes forming said emitter window in an inverted "T" shape.

8. The method of claim 1, wherein at step (b) said cap layer portion extends a lateral distance of about $0.2\mu$ to about $0.3\mu$.

9. The method of claim 1, wherein said forming step (b) includes etching said cap layer and said blocking layer.

10. The method of claim 1, wherein said forming step (b) includes the steps of reactive ion etching said cap layer and then undercutting said blocking layer to produce the cap layer extension.

11. The method of claim 10, wherein said step of undercutting includes wet etching said blocking layer.

12. The method of claim 1, wherein at step (a) said cap layer includes a material selected from the group consisting of photoresist, oxide and nitride.

13. The method of claim 1, wherein at step (a) said blocking layer includes a material selected from the group consisting of oxide, nitride and polysilicon.

14. The method of claim 1, wherein step (a) includes the step of doping said blocking layer.

15. The method of claim 1, wherein step (a) includes the step of forming said blocking layer to a thickness between about 2000 Å and about 4000 Å.

16. The method of claim 1, wherein step (a) includes the step of forming said cap layer to a thickness of about 500 Å to about 1,000 Å.

17. The method of claim 1, wherein step (a) includes the step of producing said cap layer by low pressure chemical vapor deposition.

18. The method of claim 1, wherein at step (c) said first dopant is implanted with a dosage level of about $3 \times 10^{15}/cm^2$.

19. The method of claim 1, wherein a step (e) said like polarity dopant is implanted with a dosage level of about $2 \times 10^{13}/cm^2$.

20. The method of claim 1, wherein step (c) is carried out with an implant energy less than about 50 kV.

21. The method of claim 1, wherein at step (c) said first dopant includes arsenic.

22. The method of claim 1, wherein said transistor is an NPN device, and said first polarity dopant includes arsenic.

23. A BiCMOS compatible method of fabricating, on a substrate that includes a collector region and a base region, a bipolar transistor with improved hot carrier characteristics and a MOS transistor, the method comprising the following steps:
   (a) forming above the base region and above a desired gate region a blocking layer and a cap layer overlying said blocking layer;
   (b) forming central emitter, source and drain windows in said layers;
wherein said central emitter window is formed in said layers overlying a desired central emitter region such that said cap layer extends a desired lateral distance over said emitter window;
wherein said source window and said drain window are formed in said layers overlying desired source and drain regions of the MOS transistor such that said cap layer extends a desired lateral distance over said source and drain windows;

(c) implanting at a first dosage a first dopant through said central emitter window into said desired central emitter region, and through said source window and said drain window;

(d) removing said cap layer;

(e) implanting a dopant of like polarity to said first dopant through said central emitter window and through said source and drain windows at a dosage level that is at least a factor of ten lower than said first dosage level; and (f) after at least one of steps (c) and (e), driving-in said previously implanted dopant to form an emitter region, a source region and a drain region, each of said emitter, source and drain regions having a depth determined by said driving-in step;

wherein said central emitter window determines said central emitter region's lateral extent and said cap layer portion extending over said central emitter window determines a lateral extent of a graded emitter region bounding said central emitter region of, said graded emitter region being lightly doped relative to said central emitter region; and wherein said cap layer portion extending over said source window determines a lateral extend of a graded source region bounding said source region of said MOS transistor, and said cap layer portion extending over said drain window determines a lateral extent of a graded drain region bounding said drain region of said MOS transistor, said graded source and drain regions being lightly doped relative to said source and drain regions respectively.

24. The method of claim 23, wherein step (b) includes forming said emitter window in a shape approximating an inverted "T".

25. The method of claim 23, wherein step (b) includes forming said source and drain windows in a shape approximating an upright "T".

26. The method of claim 23, wherein said step (f) includes driving-in said first dopant implanted in step (c) to form a central emitter region, a source region and a drain region, each said central emitter, source and drain region having a depth in the range of about $0.20\mu$ to about $0.30\mu$.

27. The method of claim 23, wherein said step (f) includes driving-in said like polarity dopant implanted in step (e) to a depth having a range of about $0.1\mu$ to about $0.2\mu$.

28. The method of claim 23, wherein step (f) includes driving-in after step (c) and after step (e), and said driving-in after step (e) has a time duration less than ten percent of the duration of said driving-in after step (c).

29. The method of claim 23, wherein said step (f) includes a driving-in regime selected from the group consisting of driving-in immediately after step (c) for approximately 30 minutes at about 900° C., and driving-in immediately after step (e) for approximately 30 seconds at about 900° C.

30. The method of claim 23, wherein at least one of said step (f) includes an annealing process selected from the group consisting of low temperature furnace annealing and rapid thermal annealing.

31. The method of claim 23, wherein at step (b) a said cap layer portion extends a lateral distance of about $0.2\mu$ to about $0.3\mu$.

32. The method of claim 23, wherein said forming step (b) includes etching said cap layer and said blocking layer.

33. The method of claim 23, wherein said forming step (b) includes the steps of reactive ion etching said cap layer and then undercutting said blocking layer to produce the cap layer extension.

34. The method of claim 33, wherein said step of undercutting includes wet etching said blocking layer.

35. The method of claim 23, wherein at step (a) said cap layer includes a material selected from the group consisting of photoresist, oxide and nitride.

36. The method of claim 23, wherein at step (a) said blocking layer includes polysilicon.

37. The method of claim 23, wherein step (a) includes the step of doping said blocking layer.

38. The method of claim 23, wherein step (a) includes the step of forming said blocking layer to a thickness between about 2000 Å and about 4000 Å.

39. The method of claim 23, wherein step (a) includes the step of forming said cap layer to a thickness of about 500 Å to about 1,000 Å.

40. The method of claim 23, wherein step (a) includes the step of producing said cap layer by low pressure chemical vapor deposition.

41. The method of claim 23, wherein at step (c) said first dopant is implanted with a dosage of about $3 \times 10^{15}/cm^2$.

42. The method of claim 23, wherein at step (e) said like polarity dopant is implanted with a dosage of about $2 \times 10^{13}/cm^2$.

43. The method of claim 23, wherein step (c) is carried out with an implant energy less than about 50 kV.

44. The method of claim 23, wherein at step (c) said first dopant includes arsenic.

45. The method of claim 23, wherein said transistor is an NPN device, and said first polarity dopant includes arsenic.

* * * * *